(12) United States Patent
Shohara

(10) Patent No.: US 7,095,808 B1
(45) Date of Patent: Aug. 22, 2006

(54) CODE PUNCTURING METHOD AND APPARATUS

(75) Inventor: Aki Shohara, Sunnyvale, CA (US)

(73) Assignee: Broadcom Corporation, Irvine, CA (US)

( * ) Notice: Subject to any disclaimer, the term of this patent is extended or adjusted under 35 U.S.C. 154(b) by 1008 days.

(21) Appl. No.: 09/640,963

(22) Filed: Aug. 16, 2000

(51) Int. Cl.
   *H04B 1/66* (2006.01)
(52) U.S. Cl. ...................... 375/340; 714/790
(58) Field of Classification Search ............. 375/240, 375/259, 340, 265, 246–247, 253; 714/786, 714/790, 774, 768, 752, 746; 348/14, 13
   See application file for complete search history.

(56) References Cited

U.S. PATENT DOCUMENTS

| | | | | |
|---|---|---|---|---|
| 5,511,082 A | * | 4/1996 | How et al. | 714/790 |
| 5,566,189 A | * | 10/1996 | Laskowski | 714/746 |
| 5,668,820 A | * | 9/1997 | Ramesh et al. | 714/786 |
| 5,790,566 A | * | 8/1998 | Laskowski | 714/746 |
| 5,850,403 A | * | 12/1998 | Lasne | 714/755 |
| 5,987,067 A | * | 11/1999 | Song | 375/253 |
| 6,233,713 B1 | * | 5/2001 | Van Den Berghe et al. | 714/790 |
| 6,385,752 B1 | * | 5/2002 | Li | 714/790 |
| 6,601,214 B1 | * | 7/2003 | Hammons, Jr. | 714/790 |
| 6,614,850 B1 | * | 9/2003 | Razoumov et al. | 375/259 |
| 6,693,889 B1 | * | 2/2004 | Abe et al. | 370/342 |

FOREIGN PATENT DOCUMENTS

EP    0 966 124 A    12/1999

OTHER PUBLICATIONS

European Search Report dated Sep. 8, 2003, cited from corresponding European Patent Application No. 03002477.2, filed Feb. 5, 2003.

* cited by examiner

*Primary Examiner*—Khanh Tran
(74) *Attorney, Agent, or Firm*—Sterne, Kessler Goldstein & Fox, PLLC

(57) ABSTRACT

A method of compressing a puncture mask information is disclosed, the method comprising making a delayed puncture mask by deleting the last k bits of the puncture mask; and appending k zeros to the beginning of the puncture mask; making a differential puncture mask by XORing the delayed puncture mask with the puncture mask; and compressing the differential puncture mask.

42 Claims, 11 Drawing Sheets

PRIOR ART
FIG. 1

- $T_i$ = USER DATA — 110
- $W_i$ = ENCODED DATA, CODE WORD — 120
- $P_i$ = PUNCTURE MASK — 130
- $E_i$ = DATA TRANSMITTED — 140

EGPRS, GPRS, and GSM Data Mode Puncture ROM Requirements

| Mode ID | Mask length N (bits) | Mask length (words) | Mask Period K (bits) | Code Length L (bits) | No. code words M | ROM req K+LM (bits) | ROM Req. (words) | Compress. ratio |
|---|---|---|---|---|---|---|---|---|
| TCH/F14.4 | 588 | 37 | 18 | 10 | 2 | 38 | 3 | 12.33 |
| CS-2* | 588 | 37 | 48 | 10 | 1 | 58 | 4 | 9.25 |
| CS-2 | 588 | 37 | 4 | 6 | 25 | 154 | 10 | 3.70 |
| CS-3 | 676 | 43 | 6 | 10 | 1 | 16 | 1 | 43.00 |
| MCS-1 P1* | 588 | 37 | 63 | 9 | 3 | 90 | 6 | 6.17 |
| MCS-1 P2* | 588 | 37 | 63 | 9 | 3 | 90 | 6 | 6.17 |
| MCS-1 P1 | 588 | 37 | 21 | 6 | 17 | 123 | 8 | 4.63 |
| MCS-1 P2 | 588 | 37 | 21 | 6 | 17 | 123 | 8 | 4.63 |
| MCS-2 P1 | 732 | 46 | 6 | 7 | 13 | 97 | 7 | 6.57 |
| MCS-2 P2 | 732 | 46 | 6 | 7 | 13 | 97 | 7 | 6.57 |
| MCS-3 P1 | 948 | 60 | 18 | 8 | 7 | 94 | 6 | 10.00 |
| MCS-3 P2 | 948 | 60 | 18 | 9 | 7 | 81 | 6 | 10.00 |
| MCS-3 P3 | 948 | 60 | 18 | 9 | 9 | 99 | 7 | 8.57 |
| MCS-4 P1 | 1116 | 70 | 3 | 11 | 1 | 14 | 1 | 70.00 |
| MCS-4 P2 | 1116 | 70 | 3 | 11 | 1 | 14 | 1 | 70.00 |
| MCS-4 P3 | 1116 | 70 | 3 | 11 | 1 | 14 | 1 | 70.00 |
| MCS-5 P1 | 1404 | 88 | 9 | 9 | 12 | 117 | 8 | 11.00 |
| MCS-5 P2 | 1404 | 88 | 9 | 9 | 12 | 117 | 8 | 11.00 |
| MCS-6 P1* | 1836 | 115 | 66 | 9 | 9 | 147 | 10 | 11.50 |
| MCS-6 P2* | 1836 | 115 | 66 | 9 | 9 | 147 | 10 | 11.50 |
| MCS-6 P1 | 1836 | 115 | 3 | 7 | 49 | 346 | 22 | 5.23 |
| MCS-6 P2 | 1836 | 115 | 3 | 7 | 49 | 346 | 22 | 5.23 |
| MCS-7 P1 | 1404 | 88 | 18 | 8 | 15 | 138 | 9 | 9.78 |
| MCS-7 P2 | 1404 | 88 | 18 | 8 | 15 | 138 | 9 | 9.78 |
| MCS-7 P3 | 1404 | 88 | 18 | 8 | 15 | 138 | 9 | 9.78 |
| MCS-8 P1 | 1692 | 106 | 36 | 10 | 3 | 66 | 5 | 21.20 |
| MCS-8 P2 | 1692 | 106 | 36 | 11 | 3 | 69 | 5 | 21.20 |
| MCS-8 P3 | 1692 | 106 | 36 | 11 | 3 | 69 | 5 | 21.20 |
| MCS-9 P1 | 1836 | 115 | 3 | 11 | 1 | 14 | 1 | 115.00 |
| MCS-9 P2 | 1836 | 115 | 3 | 11 | 1 | 14 | 1 | 115.00 |
| MCS-9 P3 | 1836 | 115 | 3 | 11 | 1 | 14 | 1 | 115.00 |
|  |  |  |  |  |  |  |  |  |
| Total* | 31960 | 2006 |  |  |  | 1890 | 137 | 14.64 |
| Total | 31960 | 2006 |  |  |  | 2550 | 161 | 12.46 |

*Denotes the case where multiples of the basic puncture matrix are used as the basic period K.

TABLE 1.

CODE PUNCTURING METHOD AND APPARATUS

The present invention relates to methods and apparatus for compressing and decompressing puncture masks for use in wireless communication systems.

BACKGROUND OF THE INVENTION

A goal in communication systems is to transmit and receive signals while utilizing minimal transmission channel bandwidth and keeping the overall error rate below an acceptable threshold. Channel bandwidth is filled by transmitters attempting to send ever more data. Errors occur due to interference and channel limitations which distort the data. Systems transmitting and receiving data include cell phones, personal digital assistants (PDAs), local area networks (LANs), wide area networks (WANs), and the like. Such systems may communicate unit to unit, such as cell phone to cell phone, or may use base stations, dish antennas, satellites, and the like.

Transmitted signals are corrupted in many ways before reaching the intended receiver. Interference from signals sent by other transmission sources, leakage from power lines and wired communication systems and the like will all act to corrupt a desired signal. In general, a wireless transmitter will send the transmission signal out in all directions. This transmitted signal will bounce or reflect off buildings, trees and the like. The portion of a signal that is sent along a path leading directly to receiver will reach that receiver. However, portions of the signal which reflect off a building towards the receiver will also reach the receiver. This latter portion of the signal reaches the receiver at a later time than the first portion of the signal, causing a type of interference known as multipath. These interference sources, and others, make it very difficult for a receiver to receive a transmitted signal with an acceptable degree of accuracy, and will increase the frequency of errors. The rate which errors occur in communication systems is expressed in terms of the number of bits of information transmitted, and is referred to as the bit error rate, or BER.

One conventional method of decreasing a communication system's BER is to assign to each original symbol desired to be sent to a receiver, a series of symbols called chips, which are actually sent. This assignment process is called encoding. The number symbols desired to be sent divided by the number of chips actually sent is known as the coding rate. In other words, the ratio of the encoder input rate to the encoder output rate is the coding rate. The redundancy inherent in this coding will allow the receiver to properly decode the received data even in the presence of errors in the reception of individual chips. The encoded user data is referred to as the code word.

As a simple example, assume in a binary system the symbol 1 is to be sent to a receiver. If the symbol 1 is sent and interference corrupts it such that it looks to the receiver like a 0, an error has occurred. Instead, a system may be used in which the series of chips 101 may be sent instead of the 1, and 010 may be sent for each 0. That is to say, a 1 is encoded as a 101, and a 0 is encoded as a 010. The coding rate for this system is $\frac{1}{3}$, since 3 chips are sent for each bit. If 101 is sent, and interference corrupts the $1^{st}$ chip such that it look to the receiver like a 0, the receiver will receive the series 001. Since 001 is different from 101 by only 1 chip, but is different from 010 by two chips, the receiver can easily assume that a 101, corresponding to a 1, was sent. In this situation, no bit error has occurred, even though there was one chip error.

The disadvantage of such a system is the rate of information moving from transmitter to receiver is cut by $\frac{1}{3}$ since every bit sent to the receiver requires the transmission of three chips. In situations where the interference is relatively low, this 3:1 redundancy becomes an unnecessary waste of transmission bandwidth. It is desirable to achieve an optimal compromise wherein the code rate if just sufficient to achieve the BER criteria as specified by the standard being used. For instance, in the above example it may be desirable to send only two chips per bit to the receiver. One method known to be effective in adjusting the code rate is the use of a puncture mask, wherein selected bits of the code word as defined by the puncture mask are not transmitted. A puncture mask is a binary sequence having the same length as the code word wherein a zero in the puncture mask indicates the bit is not sent, and a one indicates it is sent. On the receiving side, a zero indicates a position where an erasure is to be inserted. An erasure is an indication to the decoder that there is ambiguity about the value of the received bit.

Where a user data series has been encoded, the puncture mask can be used to delete chips in order to make better use of the available bandwidth. For example, if each symbol to be transmitted is encoded as 3 chips, the code rate would be $\frac{1}{3}$. Then, if every third chip is removed, the resulting code rate is $\frac{1}{2}$. By having a variety of puncture masks which may be used, a receiver and transmitter may adjust the coding to minimize the wasted bandwidth while keeping the BER below an acceptable threshold.

FIG. 1 shows a conventional use of a puncture mask. The series. Ti 110 is the user data that a transmitter wants to send to a receiver. The series Ti 110 is first encoded into the longer series Wi 120, which is the code word. A puncture mask Pi 130, having the same length in bits as the code word Wi 120 is then used. For each 1 in the puncture mask, the corresponding chip is transmitted. For each 0 in the puncture mask, an erasure, or deletion occurs, and the corresponding chip is not transmitted. These erasures result in a shorter data series Ei 140, which is sent to the receiver.

Ei 140 is sent by the transmitter, and is distorted by interference before it is received. What is actually received is shown as received data Ri 210 in FIG. 2. Once Ri 210 is received by the receiver, the above operation needs to be performed in reverse. Therefore, the receiver must have the same puncture mask Pi 220 available as was used by the transmitter in FIG. 1. FIG. 2 shows a received data series Ri 210, and the puncture mask Pi 220. For each 1 in the puncture mask Pi 220, the corresponding received data chip is seen as received encoded data. For each 0 in the puncture mask Pi 220, an erasure is inserted after the previous chip in the received user data. This results in the received encoded data series Si 230. This received encoded data series Si 230 can then be decoded into the received user data Ui 240, which, if everything went right, is the same as the user data series Ti 110 in FIG. 1.

As seen from the above, the transmitting unit and the receiving unit each need to have access to the puncture mask Pi 220. The length of each puncture mask Pi 220 is the same length as the code word Wi 120 in FIG. 1, which is the same length as the received encoded data series Si 230 in FIG. 2.

Some standards of wireless communication have a variety of puncture masks which may be used. The use of these puncture masks enables the coding rate to be optimized over a wide range of transmission channel conditions. With conventional means of puncturing, the puncture mask is simply stored in a memory. However, simply storing the puncture masks leads to a requirement of a fairly large memory on a VLSI chip designed to implement these wireless standards. It is thus desirable to be able to store this information on the integrated circuit in an efficient manner.

SUMMARY OF THE INVENTION

In accordance with an embodiment of the present invention, a method of compressing a puncture mask information includes making a delayed puncture mask by deleting the last k bits of the puncture mask; and appending k zeros to the beginning of the puncture mask; making a differential puncture mask by XORing the delayed puncture mask with the puncture mask; and compressing the differential puncture mask.

In another embodiment, a method of decompressing and using a puncture mask includes storing the first k bits of a decompressed differential puncture mask in a puncture mask; starting with the k+1 bit of the decompressed differential puncture mask; XORing the k+1 bit of the decompressed differential puncture mask with the 1st bit of the decompressed differential puncture mask resulting in a product; and storing the product as the k+1 bit of the puncture mask.

In accordance with another embodiment of the present invention a code puncture apparatus includes a run length decoder having an input and an output; a differential operator having a first input, a second input, and an output, the first input coupled to the output of the run length decoder; and a puncture mask register having a first input, a second input, a first output, and a second output, the second input coupled to the output of the differential operator, and the first output coupled to the second input of the differential operator.

The following detailed description and the accompanying drawing provide a better understanding of the nature and advantages of the present invention.

BRIEF DESCRIPTION OF THE DRAWINGS

FIG. 1 shows a conventional encoding and puncturing of user data before its transmission;

DESCRIPTION OF THE SPECIFIC EMBODIMENTS

Embodiments of the present invention use compression and decompression to reduce the memory required in electronic systems or on integrated circuits for storing a plurality of puncture masks.

Figure 2:
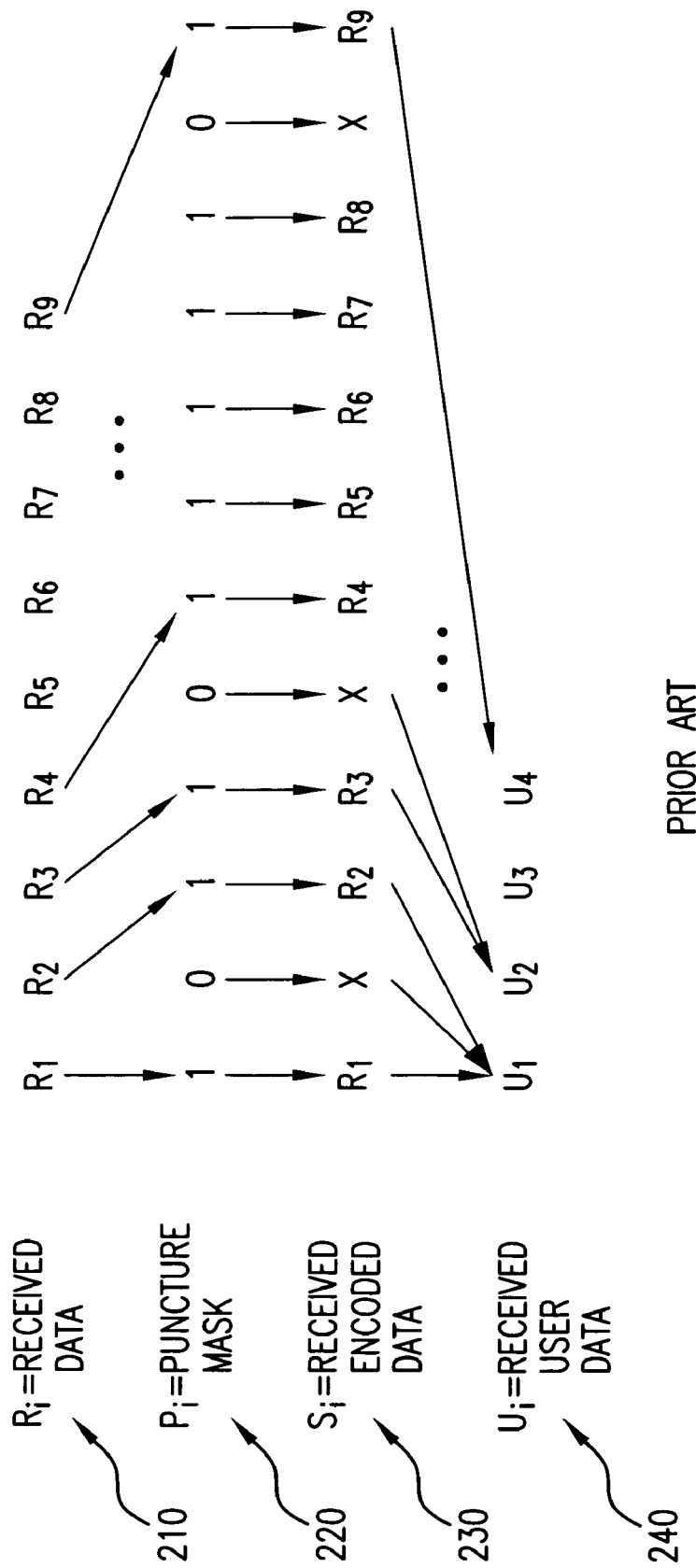
FIG. 2 shows a conventional filling with erasures and decoding of a received data series.
Figure 3:
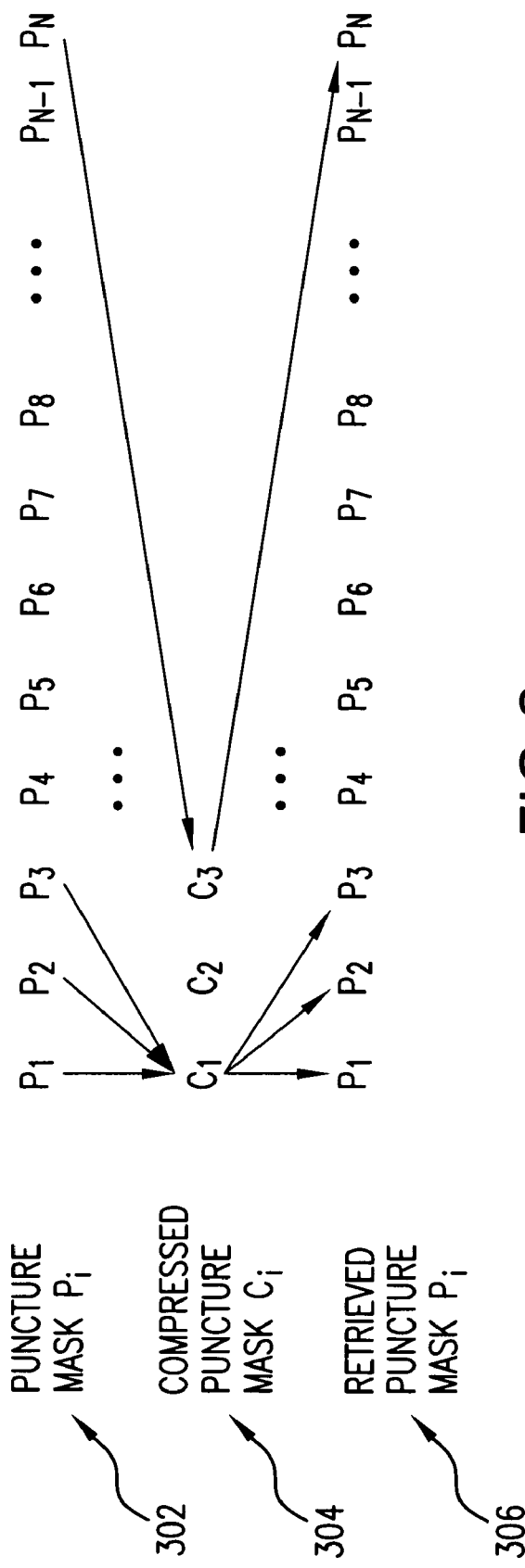
FIG. 3 shows a method of compression and decompression of a puncture mask.

FIG. 3 shows one such method of compressing and decompressing a puncture mask. A puncture mask Pi 302 having a length, or number of bits n, is provided. The bits comprising the puncture mask Pi 302 are then compressed into a series of codes Ci 304. This compression may be done by one run length compression, zero run length compression, or any other suitable compression scheme. In one run length compression, starting with the first bit of the puncture mask Pi 302, the number of consecutive ones in a series in the puncture mask 302 is counted until a zero is reached. The number of ones that was counted is then stored as a binary word. This process is continued with the next bit following the zero until bit n of the puncture mask Pi 302 is reached. Zero run length coding works in a similar fashion, except that zeros are counted.

When the puncture mask is required for use, the compressed puncture mask 304 is decompressed, resulting in the puncture mask 306, which is the same as puncture mask 302. Whatever compression method was used to compress the puncture mask Pi 302, an appropriate decompression method is required. For example, if one run length coding was used, the number of consecutive ones in a series is read from the stored binary words, and that number of ones followed by a terminating zero is appended sequentially beginning with the first bit, to the puncture mask being reconstructed.

These puncture masks, which are the same length as their corresponding code words, vary in length from about 500 bits to 1836 bits in the EDGE (Enhanced Data rate for GSM Evolution) GSM (Global System for Mobile) standard. The various embodiments of the present invention disclosed herein are applicable for puncture mask lengths of less than 1000 bits, of 1000 or more bits, or 2000 or more bits, as well as coming standards which are expected to require puncture masks of 5000 bits and beyond.

Different wireless standards are used in different parts of the world. For example, GSM is more common in Europe than in North America. Travelers moving between the continents will expect and desire their wireless communication devices to work at each stop. Therefore the need for wireless communication devices to work with more than one standard will increase in the future. The various embodiments of the present invention disclosed herein support one, two, or three or more such standards.

Furthermore, each supported standard requires several puncture masks. Various embodiments of the present invention support less than 30 puncture masks, or 30 or more puncture masks, or 40 or more puncture masks. A number of puncture masks in excess of 70 can also be supported by an embodiment of the present invention. Also, as the number of puncture masks to be stored increases, more total bits of memory are required. Embodiments of the present invention support storing a total number of puncture mask bits of less than 30k, or 30k or more. A number of puncture mask bits of at least 100k is also supported. As stated above, the present solution is to simply store these puncture masks in memory. However, supplying this much memory on a VLSI integrated circuit which also has circuitry for wireless communications adds greatly to the cost and die size. Beyond some point, adding sufficient memory to hold masks for a plurality of standards becomes impractical. The present invention provides an efficient method and apparatus for compressing these puncture masks, and decompressing them for later retrieval.

Figure 4:
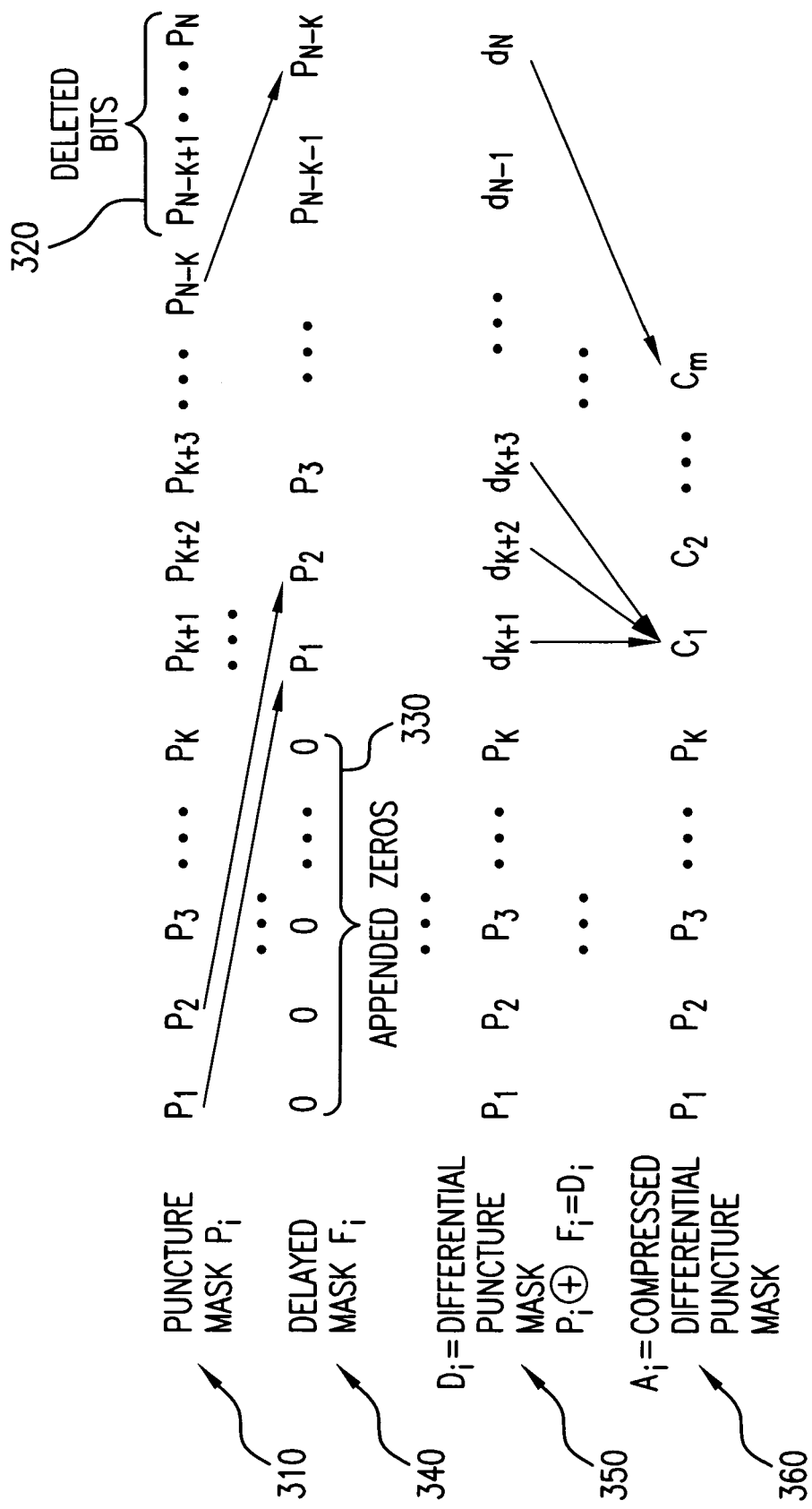
FIG. 4 shows a method of compression of a general puncture mask using a differential puncture mask in accordance with the present invention.

FIG. 4 shows one such efficient method for compressing puncture masks for later retrieval in accordance with the present invention. A puncture mask Pi 310 having n bits is provided. A number k is provided, where k is greater than one, but less than n. k will most likely have a relationship with the code rate, wherein k is an integral multiple of the reciprocal of the code rate. A k between 3 and 66 works well for many standards, but k may also be a value of 2, or greater than 66. The last k bits 320 of puncture mask 310 are deleted. A k number of zero bits 330 is appended with the front of the truncated puncture mask to form the delayed mask Fi 340. Alternately, the k zero bits 330 may be appended before the deleted bits 320 are deleted, or the appending of the zero bits 330 may result in the deletion of the deleted bits 320. Each bit i where i runs from 1 to n in the puncture mask Pi is then XORed with the corresponding bit i in the delayed puncture mask Fi, resulting in a bit i in a differential puncture mask Di 350. Alternately, since it is known that the first k bits of the puncture mask Pi 310 will be XORed with a zero, resulting in the first k bits of the differential puncture mask Di 350 being equal to the first k bits of the puncture mask Pi 310, the first k bits of the puncture mask Pi 310 may be read in to the differential puncture mask Di 350 directly. Further, an embodiment of the present invention does not compress these bits, so the first k bits of the puncture mask Pi 310 may simply be stored as is, without even being part of the differential puncture mask Di 350.

From the above it can be seen that the differential puncture mask

Di=Pi for i=1 to k, and

Di=Pi⊕Pi−k for i=k+1 to n.

Once the differential puncture mask has been computed, it can be compressed and stored electronically. The electronic storage may be done with a memory, a ROM, a plurality of flip-flops, and the like. The compression may be done in a variety of ways. One method which works well in compressing differential puncture masks utilizes zero run length coding.

The first k bits of the differential puncture mask Di 350, or alternately the first k bits of the puncture mask Pi 310, since they are the same, are stored as without modification. Beginning with the k+1 bit and moving toward the n bit of the differential puncture mask 350, each zero is counted until a one is reached. The number of zeros is stored in memory in a word of length L shown as Ci in compressed differential puncture mask 360. By way of example, if L=11, 1024 zeros followed by a one would be stored as 10000000000, and a one with no preceding zeros would be stored as 0000000000. This process is repeated until the n bit of the differential puncture mask is reached. The compressed differential puncture mask can then be stored electronically. In one embodiment, L comprises a sufficient number of bits to store the longest run of zeros in the differential puncture mask Di 350.

Figure 5:
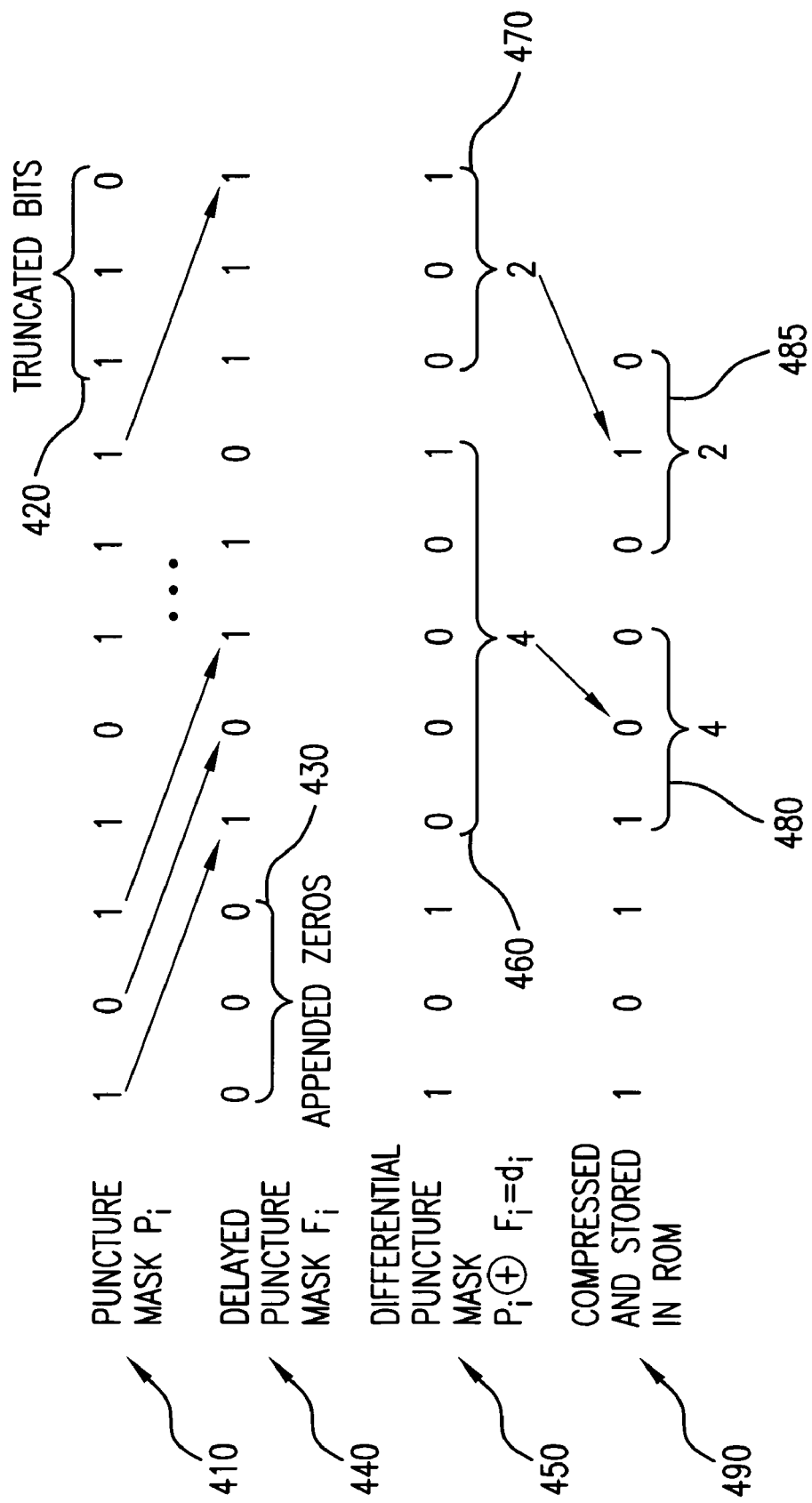
FIG. 5 shows a method of compression of a specific puncture mask using a differential puncture mask in accordance with the present invention.

FIG. 5 is a specific example of the generalized method of FIG. 4. An eleven-bit puncture mask Pi 410 is shown. In this example, k=3. The basic puncture mask, also referred to as the primary matrix, is 101, and in this case it is modified with the third repetition of this basic mask being replaced with a 111. The last k bits 420 are truncated, and k bits are appended to the front of the puncture mask 410 to make the delayed puncture mask 440. Each bit i in the puncture mask Pi 410 is XORed with its corresponding bit i in the delayed puncture mask Fi 440 to create the differential puncture mask Di 450. For example, the first bit in Pi 410, which is a one, is XORed with the first bit in delayed puncture mask Fi 440, which is a zero, resulting in a one as the first bit in the differential puncture mask Di 450. The second bit in Pi 410, which is a zero, is XORed with the second bit in delayed puncture mask Fi 440, which is also a zero, resulting in a zero as the second bit in the differential puncture mask Di 450. This is continued for all the bits in the puncture mask Pi 410.

As described above, starting with the k+1, or fourth bit, zeros are counted until a one is reached. Once a one is reached, the counting stops, the one is skipped over, and the counting resumes until the next one is reached. In this case starting with the fourth bit, four zeros are counted until a one is reached 460. Following that one, two zeros are counted until the next one 470 is reached. The four and the two are coded as binary words of length L=3, 480 and 485 respectively. The compressed data stored in ROM, or other memory type, is the first k bits of the puncture mask Pi, and the two 3 bit words 480 and 485.

It is interesting to note that in this example, if the puncture mask comprised only ten bits instead of eleven, the puncture mask would terminate with a 00 instead of a 001. Both of these strings compress to a value of 2, and thus there is an apparent ambiguity. However, the ambiguity is resolved when the 2 is decompressed into a 001, and since there is no location for the last 1 to be stored, the 001 will simply be stored as 00.

Figure 6:
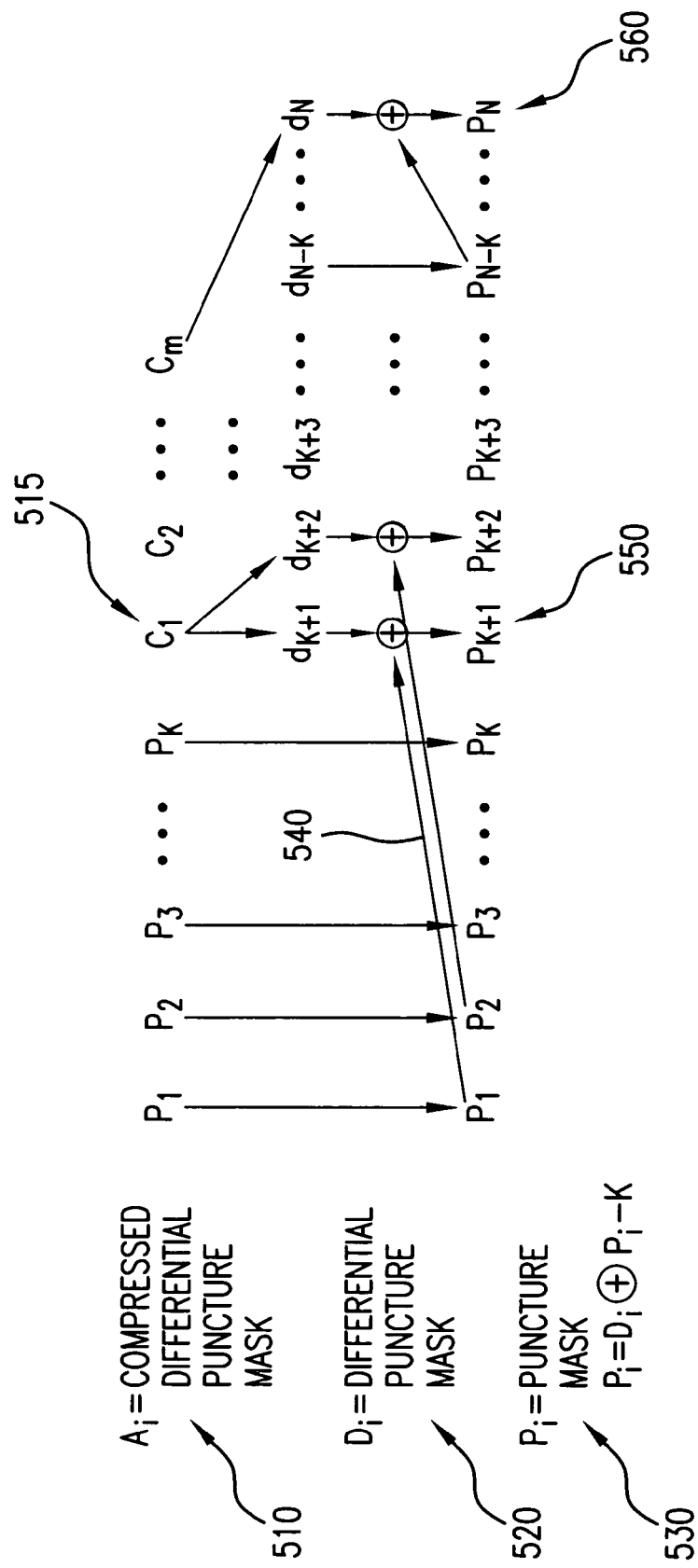
FIG. 6 shows a method of reconstructing a puncture mask from a stored compressed differential puncture mask, for the general case.

FIG. 6 shows a retrieval and reconstruction of a generalized puncture mask in accordance with the present invention. Data Ai 510 is retrieved from storage. The data may be stored in RAM, ROM, other memory, flip-flops and the like. The first k bits of Ai 510 comprise the first k bits of puncture mask Pi 530 (or differential puncture mask Di). Compressed words of length L, which are read as bits Ci 515, comprise the remainder of Ai 510. The compressed words of length L are decompressed, and read in as bits k+1 to n of differential puncture mask Di 520. The puncture mask itself is then reconstructed in the following manner. The first k bits of the compressed differential puncture mask Ai 510 are read in as the first k bits of the puncture mask Pi 530. The first bit of the puncture mask Pi 530 is XORed with the k+1 bit of the differential puncture mask, the result being the k+1 bit of the puncture mask 550. This process is repeated one bit at a time until the n−k bit of the puncture mask 530 is XORed with the n bit of the differential puncture mask 520, resulting in the n bit 560 of the puncture mask 530. The puncture mask 530 is therefore extracted from the differential puncture mask using the differential puncture mask 520, and earlier extracted bits in the puncture mask 530 itself.

From the above it can be seen that the puncture mask 530

Pi=Ai for i=1 to k, and

Pi=Di⊕Pi−k for i=k+1 to n.

where Pi is the puncture mask Pi 530, Ai is the compressed differential puncture mask 510, and Di is the differential puncture mask 520.

Figure 7:
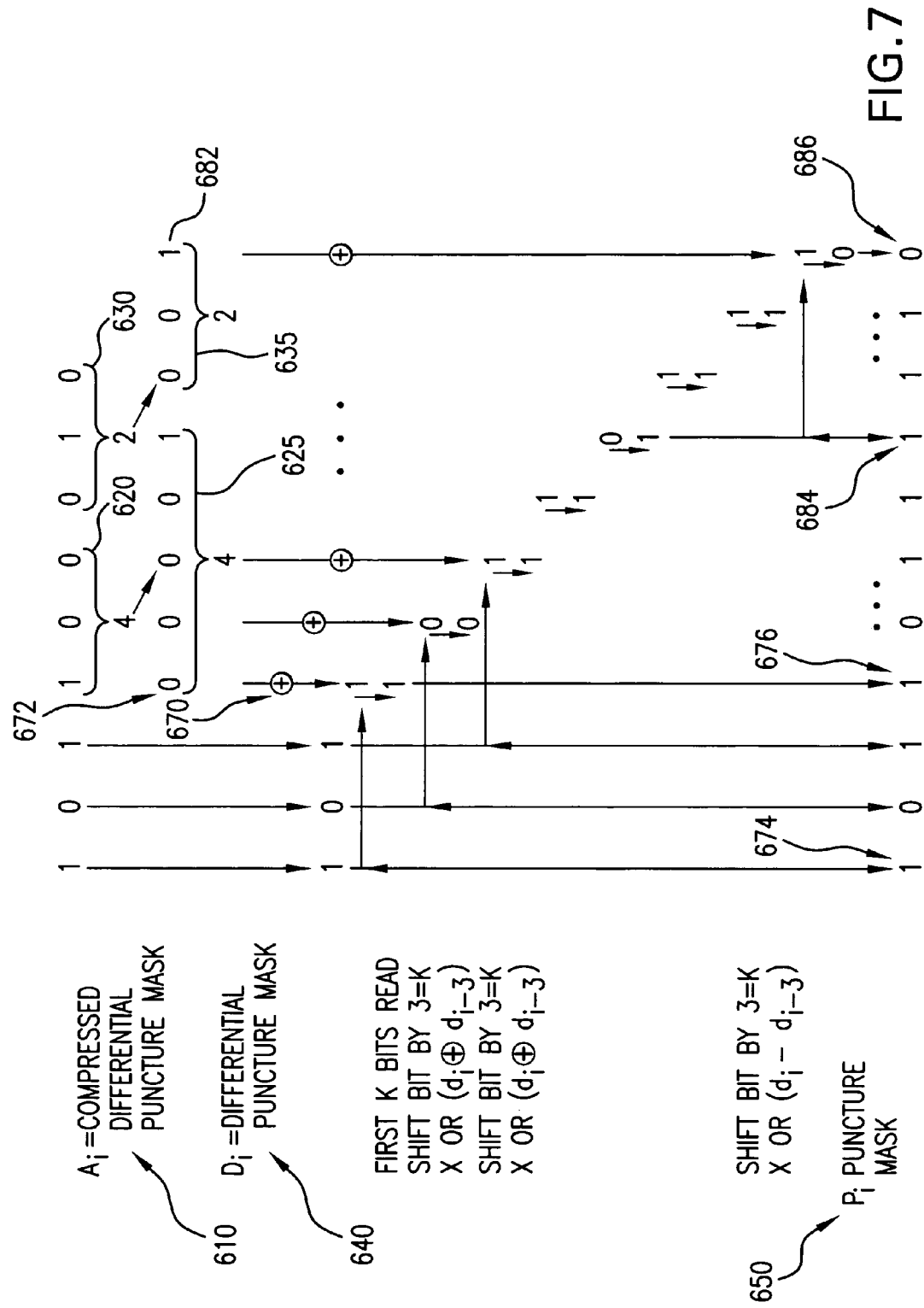
FIG. 7 shows a method of reconstructing a puncture mask from a stored compressed differential puncture mask, for a specific case.

FIG. 7 is a specific example of the generalized method shown in FIG. 6. The first 9 bits of a compressed differential puncture mask Ai 610 are shown. In this example, k=3 and L=3. These two values need to be known for each compressed differential puncture mask, and in one embodiment of the present invention are stored in control registers under command of a digital signal processor (DSP). The first k bits of the compressed differential puncture mask Ai 610 are read into the puncture mask Pi 650. Starting with the k+1 (fourth) bit in the compressed differential puncture mask Ai 610, the next L bits are taken as a binary word 620. The differential puncture mask may have been compressed using zero run length compression, or other types of compression. If the differential puncture mask was originally compressed using zero run length coding, a string of zeros equal to the value of the binary work and terminating in a one 625, is appended, starting with the k+1 position, to the differential puncture mask. In this example, the L=3 bits starting with the k+1 bit of the compressed differential puncture mask Ai 610 are 100. In this example, the code words of length L are encoded in a simple binary fashion, with the right hand most bit having a value of one, the middle bit having a value of two, and the left hand most bit having a value of four. Therefore, the 100 can be translated to a value of 1(4)+0(2)+0(1)=4. Other types of coding, gray coding, thermometer coding and the like, may alternately be used. The 100 is thus converted to a string of four zeros terminating in a one 625. The next L bits 630 of Ai 610 is 010 having a value of two, and is thus converted to a string of two zeros followed by a one 635. In this way, the differential puncture mask Di 640 is decompressed.

The puncture mask 650 is derived from the differential puncture mask 640 as described above in the general case, which was shown in FIG. 6. The bit in the k+1 (fourth) position 672 of differential puncture mask Di 640, a zero, is XORed 670 with the (k+1)−k (first) bit 674 of the puncture mask 650, a one, resulting in a one in the k+1 (fourth) position 676 in the puncture mask Pi 650. This continues, until the bit in the n position (eleventh) 682 of the differential puncture mask Di 640, a one, is XORed with the bit in the n−k (eighth) position 684 of the puncture mask Pi 650, also a one, resulting in a zero being entered in the n position (eleventh) 686 in the puncture mask Pi 650.

Figure 8:
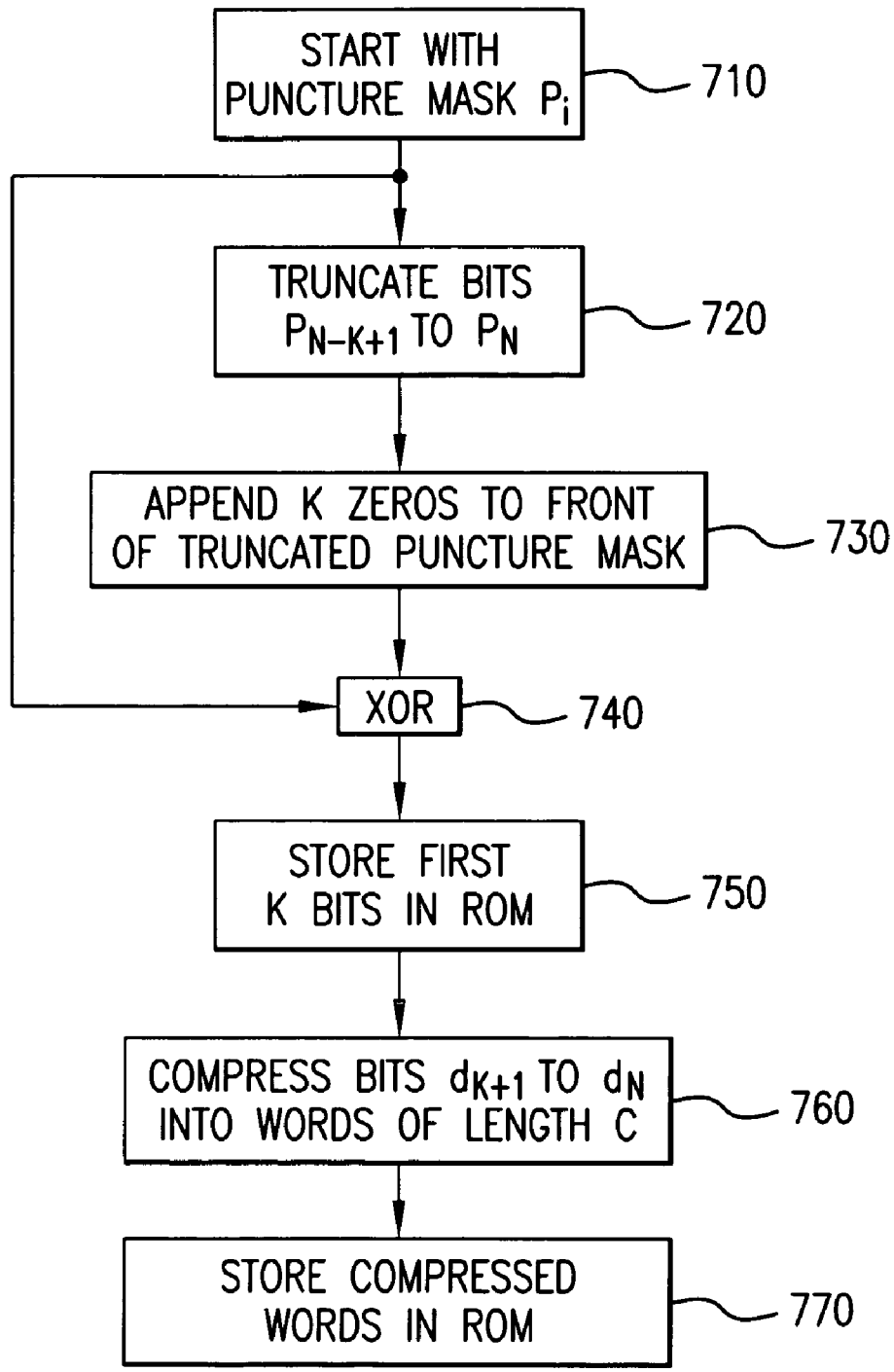
FIG. 8 is a flow chart for compressing puncture masks for electronic storage, in accordance with the present invention.

FIG. 8 is a flow chart of a method of compression for a puncture mask in accordance with the present invention. Beginning with puncture mask Pi in step 710, the last k bits, bits Pn−k+1 to Pn are deleted in step 720. K zeros are appended to the front of the truncated puncture mask in step 730 to make a delayed puncture mask. It is obvious to one skilled in the art that these two steps can be reversed. For instance, the k zeros could be shifted into a shift register n bits long and holding the puncture mask. The last k bits would be shifted out of the shift register, and in that way deleted.

The delayed puncture mask, and the original puncture mask are then XORed in step 740, creating a differential puncture mask. The first k bits of the puncture mask and the first k bits of the differential puncture mask are the same, since XORing any logic state with a zero gives a result having that same logic state. The remaining bits k+1 to n can then be compressed, and the entire result stored electronically.

The electronic storage may take place in integrated circuit memory such as a RAM, a ROM, an SRAM, flash EPROM, an array of flip-flops, and the like. The integrated circuit memory may be a separate device or, preferably, part of an integrated circuit for wireless communication. The integrated circuit for wireless communication preferably has at least a portion of a receive and transmit path on the same substrate of which the integrated circuit is made. The integrated circuit may instead have only at least a portion of a receive path, or at least a portion of a transmit path. The receive path, or portion thereof, is for receiving wireless signals, and the transmit path, or portion thereof, is for transmitting wireless signals to a different receiver. The portion of the receive path on the integrated circuit, which may be all or some of the receive path, may include all of, or a portion of, one or more of each of the following: an amplifier, limiter, bandpass filter, lowpass filter, highpass filter, mixer, image reject mixer, discriminator, polyphase filter, and the like. The portion of the transmit path on the integrated circuit, which may be all or some of the transmit path may include all of, or a portion of, one or more of each of the following: a VCO (Voltage Controlled Oscillator), DAC (Digital to Analog Converter), bandpass filter, lowpass filter, highpass filter, anti-aliasing filter, polyphase filter, mixers, image reject mixer, and the like.

The compression may be done by several means; one embodiment of the present invention uses zero run length coding. In zero run length coding, beginning with the k+1 bit, of the differential puncture mask, the zeros are counted until a one is reached. The number of zeros is translated to a binary word of length L. This translation may be done with ordinary binary weighting, gray coding, or the like. After the first one is reached, the counter is reset, and following the one, zeros are again counted until a second one is reached. This pattern continues until bit n of the differential puncture mask is reached.

Zero run length coding works well with the present invention for the following reasons. As described above, the data to be sent from a transmitter to a receiver is encoded. The encoding is done by substituting a number of chips for each bit, and then sending those chips to the receiver. The number of chips per bit is referred to as the coding rate. An encoder that substitutes 3 chips per bit is running at a ⅓ code rate. K is typically an integral multiple of the number of chips per bit. Also, the puncture mask tends to follow a pattern that is to some extent based on the number of chips per bit, and is also based on the number k. In fact, k is chosen to encompass the basic pattern that makes up the puncture mask. As stated above, this basic pattern is called the primary matrix. If the puncture mask is made up of repetitions of the primary matrix, and k is set to be equal to the number of bits in the primary matrix, then the puncture mask will be comprised of a series of bits where the first k bits are simply repeated beginning at the k+1, 2k+1, and so on bits until the bit n. In this case the differential puncture mask is the first k bits of the puncture mask, followed by all zeros. Variations in the repetition of the pattern of the first k bits can show up as two ones spaced by k positions in the differential puncture mask. Each one corresponds to a word that will be stored electronically for later decompression.

However, it is important to note here that since each variation between the pattern of the first k bits, and the bits k+1 to 2k and 2k+1 to 3k and so on, may result in two code words of length L which need to be stored electronically. From this fact, it is clear that some puncture masks will not compress well, and in fact, may expand to be longer than n bits, where n is the number of bits in the original puncture mask. Therefore, an additional flag bit may be stored with each compressed puncture mask, where a polarity of that bit indicates that the puncture mask was not compressed, but rather was just stored in memory without modification.

The fact that the primary matrix of the first k bits tends to be repeated throughout the length of a puncture mask means that puncture masks are susceptible to other compression schemes. One such method would be to use a code book approach. Each unique pattern of k bits, 0 to k, k+1 to 2k etc., required to construct the puncture mask, is stored in memory. Each k bit word is then assigned a code, for example a Huffman code. The codes are then stored in memory. When a puncture mask is required, the codes are retrieved, the corresponding k bits words are pulled from memory and concatenated to form the puncture mask.

Figure 9:
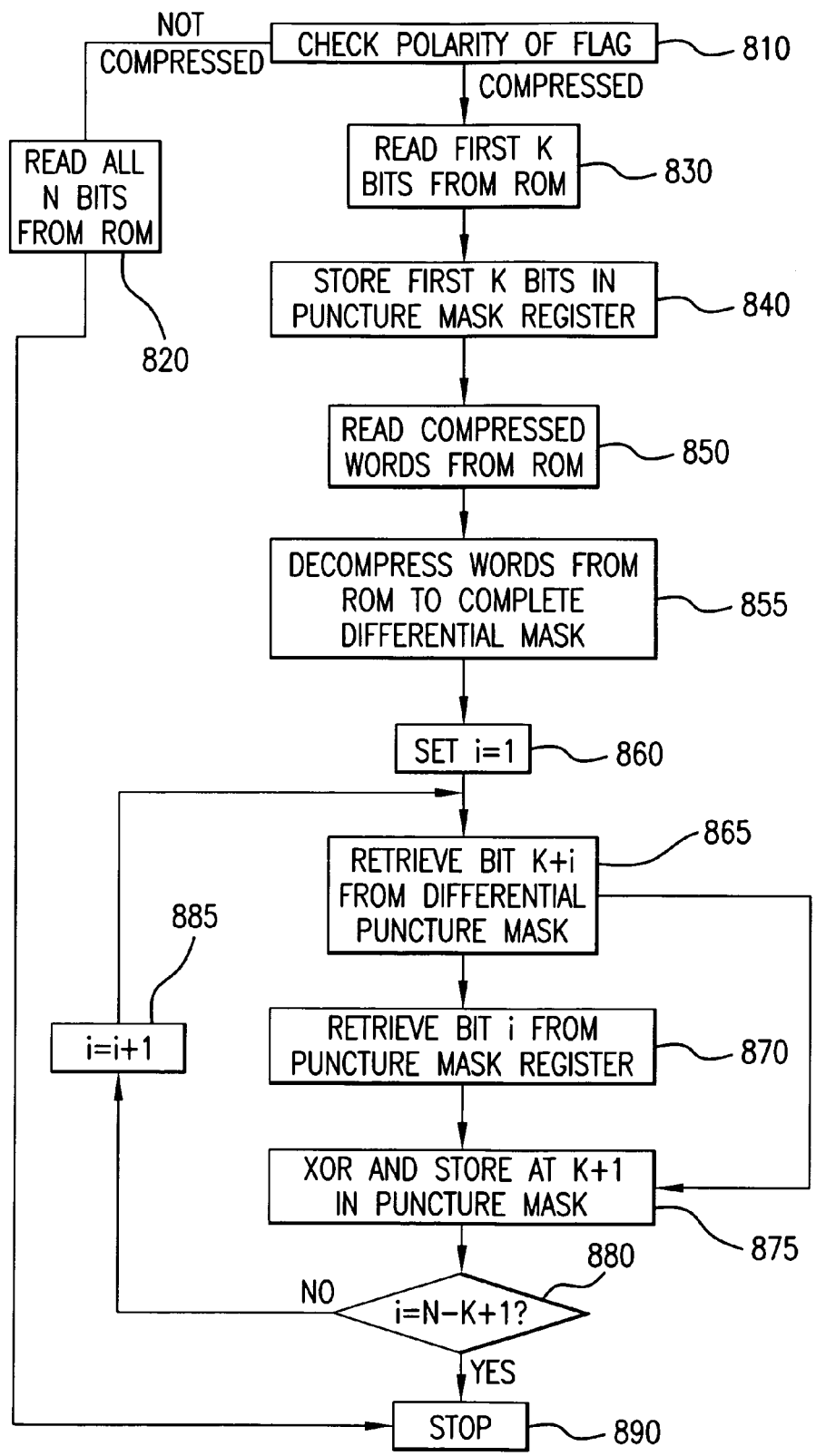
FIG. 9 is a flow chart for either reading puncture masks directly, or decompressing puncture masks from electronic storage, in accordance with the present invention.

FIG. 9 is a flow chart of a method of decompression in accordance with the present invention that incorporates this concept. The first step 810 is to check the polarity of the flag to see if the puncture mask was compressed or not. If the polarity is such that it indicates the puncture mask was not compressed, then the entire puncture mask is read from memory in step 820, and the process stops, step 890. If the indication is that the puncture mask was compressed, then the first k bits of a differential puncture mask are read from storage 830, and placed in a puncture mask register in step 840. The compressed code words of length L are read back a word at a time in step 850, and the code words are decompressed to complete the differential puncture mask in step 855.

One embodiment of the present invention uses zero run length decoding to decompress the code words. In zero run length decoding, the word to be decoded is given a value. In one embodiment of the present invention, the value given is based on the binary weighting of the bits in the word. For example a one in the LSB (least significant bit) has a weight of one, the a one in the next position has a weight of two, then 4, then 8 and so on, following the formula of $2^{n-1}$ where n is the bit location position starting with one for the LSB and incrementing by one for each place. Other means may be used to assign values to the code words, such as gray code, and the like. A number of zeros corresponding to this value followed by a terminating one is then appended to the differential puncture mask, beginning with the k+1 position in the differential puncture mask. This pattern is then repeated until all the code words making up the stored differential puncture mask has been read back and decompressed.

The puncture mask may then be derived from the differential puncture mask as follows. A counter with an count of i may be reset to 1. The k+i bit from the differential puncture mask is retrieved 865, as is the i bit of the puncture mask itself in step 870. The k+1 bit of the differential puncture mask is then XORed with the i bit of the puncture mask with a result that is stored in the puncture mask at position k+1. This process continues until i is equal to n−k+1 in step 880, when the process ends at step 890. If i is less than n−k+1, where n is the length of the puncture mask, which is the same as the differential puncture mask, i is incremented by one in step 885, and the appropriate values are retrieved in steps 865 and 870 again. It is important to note that the process of reconstructing the puncture mask from the differential puncture mask requires using the differential puncture mask, as well as earlier computed bits in the puncture mask itself.

Figure 10:
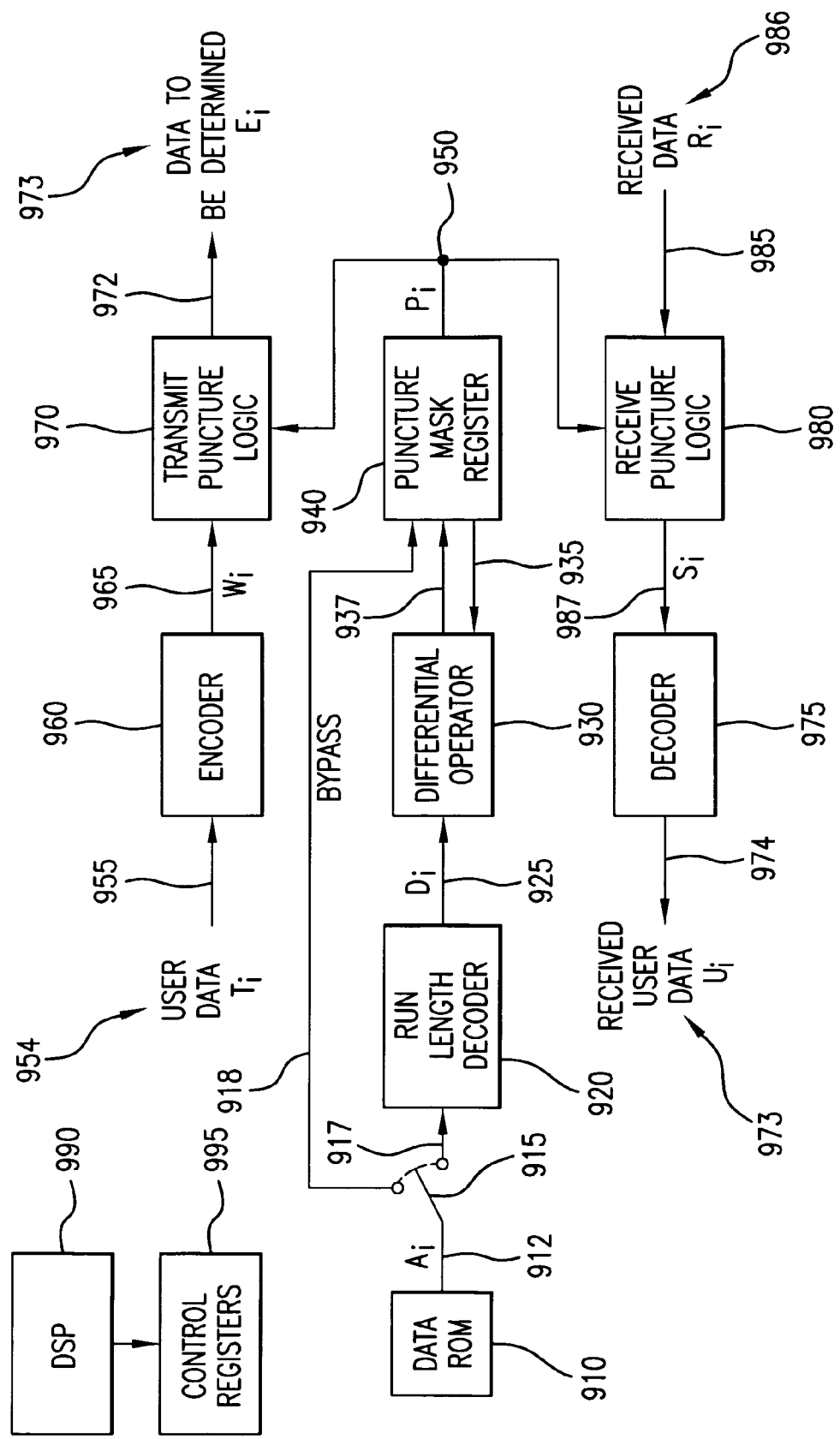
FIG. 10 is a block diagram of an apparatus used for reconstructing puncture masks, which may be referred to as a code puncturing accelerator; and Table 1 highlights the details of calculations for finding the compression ratios achieved by a method of compression in accordance with the present invention.

An apparatus in accordance with the present invention which uses this last concept is shown in block diagram form in FIG. 10. This apparatus can be referred to as a code puncturing accelerator and is part of an integrated circuit for wireless communication. This apparatus can reconstruct or generate a puncture mask when it is required, and can then use that mask to puncture, or delete bits from a code word, and can insert erasures into a received data bit stream. The apparatus comprises a data ROM 910, a run length decoder 920, a differential operator 930, a puncture mask register 940, an encoder 960, a transmit puncture logic block 970, a decoder 975, a receive puncture logic block 980, a DSP 990, and control registers 995. The data ROM 910 has an output 912 coupled to a switch 915. The data ROM may alternately be any type of semiconductor memory, such as RAM, flip-flops, E PROM, flash E PROM, SRAM, or the like. The switch has two positions for coupling either to a run length decoder 920 input on line 917, or a bypass line 918 coupled to a first input of the puncture mask register 940. The run length decoder 920 has an input coupled to a switch position of switch 915, and an output coupled to a first input of a differential operator 930 by line 925. The differential operator 930 also has a second input coupled to the puncture mask register 940 by line 935, and an output also coupled to a second input of the puncture mask register by line 937. The puncture mask register 940 also has a second output coupled to a second input of the transmit puncture logic 970 by line 950, and a second input of the receive puncture logic 980, also by line 950.

The receive puncture logic 980 has a first input 985, on which is received receive data Ri 986, as well as an output coupled to the input of the decoder 975 on line 987. The decoder 975 also has an output 974, on which is output the received user data Ui 973. The transmit puncture logic 970 has an output 972 on which the transmit puncture logic 970 outputs data to be transmitted 973, as well as a first input coupled to the output of an encoder 960 by line 965. The encoder also has an input 955 on which it receives user data Ti 954. Control registers 995 are under the control of the DSP 990.

One mode of operation in accordance with the present invention follows. The DSP 990 recognizes that a new puncture mask is required for use in transmitting data. A flag in the control registers 995 is checked to see if the puncture mask was compressed. If the required puncture mask was not compressed, switch 915 couples the output 912 of the data ROM 910 to the bypass line 918, and the entire puncture mask is read out onto the bypass line 918 and stored in the puncture mask register 940.

If the flag in control register 995 indicates that the mask was compressed, then the starting address of the puncture mask, as well as parameters k, L, and M for the required puncture mask are read from control registers 995. The switch 915 couples the output 912 of the data ROM 910 to the bypass line 918, and the first k bits are loaded into the puncture mask register 940. Switch 915 then couples the output 912 of the data ROM 910 to the input of the run length decoder 920. A binary code word of length L is then read into the run length decoder, and a number of zeros followed by a one, where the number of zeros is equal to the value of the code word of length L. One embodiment in accordance with the present invention may load the code word into a down counter, and for each down count, output a zero, until a count of zero is reached, whereupon a one is output, and a new code word loaded into the run length decoder. The output signal of the run length decoder 920 is on the line 925, and is the differential puncture mask. The differential puncture mask thus enters the differential operator one bit at a time at its first input, on line 925, starting with the bit in the k+1 position. Note that the first k bits have bypassed the run length decoder 920 as well as the differential operator 920 by using the bypass line 918, and are thus already in the puncture mask register 940. The differential operator also retrieves the (k+1)−k, or first bit of the puncture mask from the puncture mask register 940 on line 935. The differential operator then takes the XOR of the k+1 bit of the differential puncture mask at its first input on line 925, and the first bit of the puncture mask on its second input line 935 from the puncture mask register, and outputs the result at its output 937 for input to the puncture mask k+1 position in the puncture mask register 940.

The run length decoder 920, the differential operator 930, and the puncture mask register 940 can be clocked together. In this way, in each clock cycle, the down counter in the run length decoder counts down by one, the differential operator retrieves one bit from the puncture mask register and performs one XOR operation, and the puncture mask register inputs the result from the previous clock cycle into the puncture mask. This will continue until the down counter in the run length decoder 920 reaches zero, at which time a second counter is incremented by one. The value of this second counter is checked to see if it has reached the value of M. If it has not, the next code word of length L is entered into the run length decoder 920, and the count down process continues. When the count down counter has counted down M number of time and the last terminating one has been operated on, the puncture mask is complete.

Either during or after the reconstruction of the puncture mask in the puncture mask register 940, the puncture mask may be sent, either a bit at a time or all at once, to the transmit puncture logic 970. User data Ti 954 is placed on line 955 for encoding by encoder 960. Encoder 960 is typically a convolutional coder, though other coders may be used in various embodiments of the present invention. Encoder 960 may substitute some number of bits, referred to as chips, for each bit of user data Ti, thus outputting encoded data on line 965 for input at the first input of the transmit puncture logic 970 The encoded data on line 965, the code word, and the puncture mask in puncture mask register 940 are both comprised of the same number of bits n. The transmit puncture logic 970 then will erase or delete each bit i in the encoded data on line 965 which corresponds to a zero in the i position in the puncture mask in the puncture mask register 940, and will output each bit i in the encoded data on line 965 which corresponds to a one in the i position in the puncture mask in the puncture mask register 940.

Alternately, or concurrently, either during or after the reconstruction of the puncture mask in the puncture mask register 940, the puncture mask may be sent, either a bit at a time or all at once, to the second input of the receive puncture logic 980 on line 950. Received data Ri 986 is received on line 985, and input to the first input of the receive puncture logic 980. The receive puncture logic will look at the puncture mask on line 950, and the receive data Ri 986 on line 985 one bit at a time. If the present bit i in the puncture mask is a one, the present bit of the received data Ri 986 is output to the decoder on line 987. If the present bit i in the puncture mask is a zero, an erasure is inserted in the received data Ri 986, and the next bit in the puncture mask in the puncture mask register 940 is checked. This process continues for all n–x bits of the received data Ri, where n is the number of bits in the encoded user data, as well as the puncture mask, and x is the number of erasures or deletions which corresponds to the same number of zeros in the puncture mask.

As described above, the control register written by the DSP specifies the puncture mode. The control register needs to store the following: the length n of puncture mask which is equal to the code word, the length k, the length L of the compressed words, the compression flag, which indicates whether the puncture mask has been compressed, and the ROM start address of the stored puncture mask.

Table 1 is a summary of the compression ratios actually achieved using some of the methods described above. The first column 1010 lists some mode identifiers which define the mask to be used, in EGPRS, GPRS, and GSM systems. The asterisks denote duplicate entries, wherein the duplicate entry is compressed using a larger k than the corresponding entry with the asterisk absent. For example, the second entry CS-2* was compressed using k=48, while CS-2, the same puncture mask, was compressed using k=4. The disadvantage of a larger k is that hardware complexity may increase somewhat, and the delay in the differential operation is substantially longer.

The puncture mask length n, as defined in the appropriate standard is given in column 1020. The puncture mask length in words is simply n/16 rounded up to the next highest integer (that is, the roof value of n/16), and is given in column 1030. This is the number of words that the puncture mask would take in a 16 bit wide memory if no compression was used. The k for each puncture mask is given in column 1040, and as described above, for some puncture masks, the results of more than one k is given. As mentioned above, there is nothing in the various standards that give a value for k. Rather, k is a parameter chosen based on engineering judgment for each puncture mask, after examination of the primary matrix and the puncture mask itself. A computer program, or the like, which simply tries each k from 1 to n, or from 2 to n/2, or some other range, and calculates the compression may alternately be used.

The code length L is given for each puncture mask in column 1045. L is simply the smallest binary number that will describe the longest run of zeros in the differential puncture mask corresponding to the puncture mask being compressed. The number of code words required to describe bits k+1 to n of the differential puncture mask corresponding to the puncture mask being compressed is listed in column 1050.

For example, the fourth entry, CS-3 has N=676, k=6, L=10, and M=1. As described above, the first 6 bits are stored, leaving the next 670 to be compressed. In this case the puncture mask is just these same 6 primary matrix bits repeated 112 times, followed by the first four bits repeated one more time. The differential puncture mask from bits 7 to 676 is all zeros, and can be compressed as one word 10 bits in length. ($2^{10}$=1024, which is large enough to describe value of 670.) Therefore, L must be 10, and M can be one, since only one word is required. It is of interest to note, that, as in this example, k does not need to be defined such that n is an integral multiple of k.

The total memory required is tabulated in column 1055, and is calculated by summing the number of bits required to store k, along with the M number of L bit words. In equation form the number of bits required is k+L times M. The number of words in memory required to store the information is the value in 1055 divided by 16, again rounded up to the next highest integer, and is shown in column 1060. The compression ratio can thus be found by dividing the number of words required to store the uncompressed mask, column 1030, by the number of words required to store the compressed mask, column 1060. The result of this calculation is found in column 1065.

The total combined compression ratio can be calculated by adding the number of words required to store the uncompressed mask for each entry in column 1030 and dividing it by the total number of words required to store the compressed mask for each entry in column 1060. Since some masks were compressed twice, the entries with the larger k, denoted with an asterisk, are counted in the Total* row 1070, and the entries with the smaller k, no asterisk, are counted in the Total row 1080.

The overall compression ratios are 14.64, including entries with a large k, and 12.46 including entries with a small k. This shows that a compression method in accordance with the present invention works very well. This reduction is storage requirements will save space on an integrated circuit, thereby reducing its cost. The overhead to employ this compression is an apparatus, which may be referred to as a code puncturing accelerator, and storage, which may be in a control register, for k, L, M, and the starting address of the puncture mask.

While the description above provides a full and complete disclosure of the preferred embodiments of the present invention, various modifications, alternate constructions, and equivalents will be obvious to those with skill in the art. Thus, the scope of the present invention is limited solely by the metes and bounds of the appended claims.

What is claimed is:

1. A method of compressing a puncture mask comprising:
   making a delayed puncture mask by:
      deleting the last "k" bits of the puncture mask; and
      appending "k" zeros to the beginning of the puncture mask;
   making a differential puncture mask by XORing the delayed puncture mask with the puncture mask; and
   compressing the differential puncture mask.

2. The method of claim 1 further comprising:
   storing the differential puncture mask in a semiconductor memory.

3. The method of claim 1, wherein compressing the differential puncture mask comprises:
   starting with the "k"+1 bit of the puncture mask, counting the number of zeros until a one is reached; and
   storing the number of zeros in memory.

4. The method of claim 1 wherein the length of the puncture mask is at least 1000 bits.

5. The method of claim 1 wherein the length of the puncture mask is at least 2000 bits.

6. The method of claim 1 wherein puncture masks from at least two communication standards are compressed.

7. The method of claim 1 wherein at least 30 puncture masks are compressed.

8. A method of decompressing and using a puncture mask comprising:
   providing a compressed differential puncture mask;
   decompressing the compressed differential puncture mask;
   storing the first "k" bits of the decompressed differential puncture mask as the first "k" bits of a decompressed puncture mask;
   starting with the "k"+1 bit of the decompressed differential puncture mask;
   XORing the "k"+1 bit of the decompressed differential puncture mask with the 1st bit of the decompressed differential puncture mask resulting in a product; and
   storing the product as the "k"+1 bit of the decompressed puncture mask.

9. The method of claim 8 wherein the length of the decompressed puncture mask is at least 1000 bits.

10. The method of claim 8 wherein the length of the decompressed puncture mask is at least 2000 bits.

11. The method of claim 8 wherein puncture masks from at least two communication standards are compressed.

12. The method of claim 8 wherein at least 30 puncture masks are compressed.

13. The method of claim 8 further comprising:
   continuing with each bit in the decompressed differential puncture mask until the last bit is reached;
   XORing cacti "k"+1 bit of the decompressed differential puncture mask with an "i" bit of the puncture mask resulting in a product; and
   storing the product as the "i" bit of the decompressed puncture mask.

14. The method of claim 13 further comprising wherein the decompressing of the compressed differential puncture mask is done using run length decoding.

15. The method of claim 14 wherein the run length decoding comprises:
   starting with the "k"+1 bit of the compressed differential puncture mask;
   creating a decompressed differential puncture mask by writing in series a number of zeros corresponding to a value given by the next "L" bits of the compressed differential puncture mask; and
   writing a one to the decompressed differential puncture mask.

16. The method of claim 15 wherein the run length decoding further comprises:
   repeating the starting, creating, and writing, beginning with the "k"+1+("n")("L") bit of the compressed differential puncture mask, wherein "n" is incremented by one each time, until an end of the compressed differential puncture mask is reached.

17. The method of claim 16 further comprising:
   after the storing the product as the "i" bit of the puncture mask, using the puncture mask to delete chips from a data sequence, wherein a bit in the puncture mask having a first polarity results in a first corresponding bit in the data sequence being deleted, and a bit in the puncture mask having a second polarity results in a second corresponding bit in the data sequence not being deleted.

18. The method of claim 16 further comprising:
   after the storing the product as the "i" bit of the puncture mask, reading a data sequence one bit at a time;
   reading the puncture mask one hit at a time simultaneously with reading the data sequence one bit at a time;
   inserting an erasure after the previously read data sequence bit if the corresponding puncture mask bit has a first polarity, and not inserting an erasure after the previously read data sequence bit if the corresponding puncture mask bit has a second polarity.

19. A code puncture apparatus comprising:
   a run length decoder having an input and an output;
   a differential operator having a first input, a second input, and an output, the first input coupled to the output of the run length decoder; and
   a puncture mask register having a first input, a second input, a first output, and a second output, the second input coupled to the output of the differential operator, and the first output coupled to the second input of the differential operator.

20. The apparatus in claim 19 further comprising:
   a semiconductor memory for storing compressed puncture masks; and
   a switch coupled to the output of the semiconductor memory and having two positions, wherein a first position is coupled to the input of the run length decoder, and a second position is coupled to the first input of the puncture mask register.

21. A method of electronically storing puncture masks comprising:
   compressing a puncture mask via a compression circuitry, wherein the puncture mask is a series of bits, each bit being associated with an encoded data bit for determining whether the encoded data bit is to be transmitted, wherein the compressing of the puncture mask comprises:
   generating a first set of bits based on the puncture mask;
   generating a second set or bits by performing an XOR function with the first set of bits and the puncture mask; and
   compressing the second set of bits; and
   storing the compressed puncture mask electronically.

22. The method of claim 21 wherein the length of the puncture mask before compressing is at least 1000 bits.

23. The method of claim 21 wherein the length of the puncture mask before compressed is at least 2000 bits.

24. The method of claim 21 wherein puncture masks from at least two communication standards air compressed.

25. The method of claim 21 wherein at least 30 puncture masks are compressed.

26. The method of claim 21 wherein the compressed puncture mask is stored electronically in a semiconductor memory.

27. A method of using puncture masks comprising:
   retrieving a compressed puncture mask from a semiconductor memory, the compressed puncture mask being generated via a compression circuitry that compresses puncture mask data;
   decompressing the compressed puncture mask via a decompression circuitry to generate the puncture mask data, wherein the compressing of the puncture mask comprises:
   generating a first set of bits based on the puncture mask;
   generating a second set of bits by performing an XOR function with the first set of bits and the puncture mask; and
   compressing the second set or bits; and
   deleting particular bits from a data sequence according to the puncture mask data in the decompressed puncture mask.

28. The method of claim 27 wherein the length of the decompressed puncture mask is at least 1000 bits.

29. The method of claim 27 wherein the length of the decompressed puncture mask is at least 2000 hits.

30. The method of claim 27 wherein puncture masks from at least two communication standards are compressed.

31. The method of claim 27 wherein at least 30 puncture masks are compressed.

32. The method of claim 27 further comprising:
   using the decompressed puncture mask to delete chips from a data sequence, wherein a bit in the decompressed puncture mask having a first polarity results in a first corresponding bit in the data sequence being deleted, and a bit in the decompressed puncture mask having a second polarity results in a second corresponding bit in the data sequence not being deleted.

33. The method of claim 27 further comprising:
   reading a data sequence one bit at a time;
   reading the puncture mask one bit at a time simultaneously with reading the data sequence one bit at a time;
   inserting an erasure after the previously read data sequence bit if the corresponding puncture mask bit has a first polarity, and not inserting an erasure after the previously read data sequence bit if the corresponding puncture mask bit has a second polarity.

34. An integrated circuit having a memory wherein the memory comprises a plurality of compressed puncture masks, each comprised puncture mask being generated via a compression circuitry that compresses puncture mask data, wherein the compressing of the puncture mask includes generating a first set of bits based on the puncture mask, generating a second set of bits by performing an XOR function with the first set of bits and the puncture mask data, and compressing the second set of bits, the compressed puncture mask being retrieved from the memory and decompressed via a decompression circuitry to generate the puncture mask data, the puncture mask data in the decompressed puncture mask being used to delete particular bits from a data sequence.

35. The integrated circuit of claim 34 further comprising circuitry for wireless communications.

36. The integrated circuit of claim 34 wherein the length of one of the plurality of puncture masks before compression is at least 1000 bits.

37. The integrated circuit of claim 34 wherein the length of one of the plurality of puncture masks before compression is at least 2000 bits.

38. The integrated circuit of claim 34 wherein puncture masks from at least two communications standards are compressed.

39. The integrated circuit of claim 34 wherein at least 30 puncture masks are compressed.

40. The integrated circuit of claim 35 wherein the circuitry for wireless communications comprises at least a portion of a receive path including at least a portion of a mixer.

41. The integrated circuit of claim 35 wherein the circuitry of wireless communications comprises at least a portion of a transmit path including at least a portion of a mixer.

42. The integrated circuit of claim 41 wherein the portion of the transmit path further comprises at least a portion of a VCO.

* * * * *

UNITED STATES PATENT AND TRADEMARK OFFICE
CERTIFICATE OF CORRECTION

PATENT NO. : 7,095,808 B1
APPLICATION NO. : 09/640963
DATED : August 22, 2006
INVENTOR(S) : Aki Shohara It is certified that error appears in the above-identified patent and that said Letters Patent is hereby corrected as shown below:

- At column 14, line 6, "cacti" should be replaced with --each--.
- At column 15, line 12, "set or bits" should be replaced with --set of bits--.
- At column 15, line 22, "air" should be replaced with --are--.
- At column 15, line 41, "set or bits" should be replaced with --set of bits--.
- At column 16, line 23, "data" should be deleted.

Signed and Sealed this

Sixth Day of March, 2007

JON W. DUDAS
*Director of the United States Patent and Trademark Office*

UNITED STATES PATENT AND TRADEMARK OFFICE
CERTIFICATE OF CORRECTION

PATENT NO. : 7,095,808 B1
APPLICATION NO. : 09/640963
DATED : August 22, 2006
INVENTOR(S) : Aki Shohara It is certified that error appears in the above-identified patent and that said Letters Patent is hereby corrected as shown below:

- At column 14, line 6, "cacti" should be replaced with --each--.
- At column 15, line 12, "set or bits" should be replaced with --set of bits--.
- At column 15, line 22, "air" should be replaced with --are--.
- At column 15, line 41, "set or bits" should be replaced with --set of bits--.
- At column 16, line 23, "data" should be deleted.

Signed and Sealed this

Twentieth Day of March, 2007

JON W. DUDAS
*Director of the United States Patent and Trademark Office*